(12) United States Patent
Lo et al.

(10) Patent No.: US 7,327,081 B2
(45) Date of Patent: Feb. 5, 2008

(54) STACKED ORGANIC ELECTROLUMINESCENT DEVICE AND METHOD FOR MANUFACTURING THEREOF

(75) Inventors: Shih-Kuei Lo, Taoyuan (TW);
Shuenn-Jiun Tang, Jhubei (TW);
Jie-Hunag Wu, Pingjhen (TW);
Chun-Chung Lu, Dali (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 323 days.

(21) Appl. No.: 11/217,282

(22) Filed: Aug. 31, 2005

(65) Prior Publication Data

US 2007/0046190 A1    Mar. 1, 2007

(51) Int. Cl.
H01J 1/62    (2006.01)
H01J 63/04   (2006.01)

(52) U.S. Cl. .................................. 313/506; 313/504
(58) Field of Classification Search ................. 313/506
See application file for complete search history.

(56) References Cited

U.S. PATENT DOCUMENTS 6,596,134 B2 *   7/2003  Forrest et al. ....... 257/E51.029
6,844,957 B2 *   1/2005  Matsumoto et al. ........ 359/296
6,984,934 B2 *   1/2006  Moller et al. ............... 313/506
2001/0000005 A1 * 3/2001 Forrest et al. .............. 313/506
2004/0027059 A1 * 2/2004 Tsutsui ....................... 313/504
2005/0140278 A1 * 6/2005 Kato .......................... 313/506

* cited by examiner

Primary Examiner—Nimeshkumar D. Patel
Assistant Examiner—Peter Macchiarolo
(74) Attorney, Agent, or Firm—J.C. Patents

(57) ABSTRACT

A stacked organic electroluminescent device, which includes a substrate, an anode layer, organic emitting layers, carrier generation layers, reflecting layers and a cathode layer, is provided. The substrate has first emitting region, second emitting region, and third emitting region. The anode layer is above the substrate. And above the anode layer are the following layers sequentially: a first organic emitting layer, a first carrier generation layer, a second organic emitting layer, a second carrier generation layer, and a third organic emitting layer. The first reflecting layer, the second reflecting layer, and the third reflecting layer are in the stacked structure. And each of them is disposed corresponding to the first emitting region, the second emitting region, and the third emitting region. The cathode layer is on the third organic emitting layer. The stacked organic electroluminescent device has full color spectrum, improved luminant efficiency, and color purity.

19 Claims, 8 Drawing Sheets

STACKED ORGANIC ELECTROLUMINESCENT DEVICE AND METHOD FOR MANUFACTURING THEREOF

BACKGROUND OF THE INVENTION

1. Field of Invention

The present invention relates to an organic electroluminescent device and method for manufacturing thereof. In particular, it relates to a stacked organic electroluminescent device (Stacked OLED) and method for manufacturing thereof.

2. Description of Related Art

The organic electroluminescent device (OLED) is a device using the luminescent characteristic of organic functional materials for providing display purposes, its luminescent structure typically is constructed of a pair of electrodes and organic functional material layers. As the current passes through the area between the anode and the cathode, the electrons and the holes in the organic functional material layers are recombined to produce photons, thus allowing the organic functional material layers, according to its material characteristics, to produce light emitting mechanisms for the different emitting colors.

In the manufacturing process of the full color spectrum organic emitting device, the conventional technology fabricates a plurality of red (R), green (G), and blue (B) organic luminescent structures. In addition, the aforementioned R, G, B organic luminescent structures are assorted to produce an organic emitting device with full color spectrum results. But, in this kind of full color spectrum organic emitting device, the diminishing life cycles and the luminescent brightness of each color of organic functional material are different. Therefore, the organic emitting device faces issues regarding discrepancies in luminescent purity or in brightness for each color.

To solve the aforementioned issues, researchers have proposed a multilayer stacked OLED for producing single-colored light or white light organic electroluminescent device with higher luminant efficiency. It takes several single-colored light or white light organic electroluminescent devices stacked together to increase their luminant efficiency. FIG. 1 illustrates a schematic diagram for a multilayer stacked OLED. Referring to FIG. 1, this multilayer stacked OLED 100 has a substrate 110, a pair of electrodes 120, 130, a plurality of organic emitting layers 140, and a plurality of electrically conductive layers 150. The organic emitting layers 140 are mutually stacked. In addition, the electrically conductive layers 150 are located between each two organic emitting layers 140. As the current passes through the area between the electrodes 120, 130, the electrons 160, and the holes 170 in each organic emitting layer 140, will be recombined to form a photon 180. Therefore, as illustrated in FIG. 1, via the compounding effect of the photons 180, the luminant efficiency for the multilayer stacked OLED 100 is thus improved. But the structure illustrated in FIG. 1 only shows the single-colored light or white light, the demands for full color spectrum cannot be achieved.

SUMMARY OF THE INVENTION

Based on the above, the objective of the present invention is to provide a stacked organic electroluminescent device that can fulfill the full color spectrum demands, and provide improved luminant efficiency and color purity.

Another objective of the present invention is to provide a method for the manufacturing of a stacked organic electroluminescent device. It is capable of manufacturing the stacked organic electroluminescent device with full color spectrum, improved luminant efficiency, and improved color purity.

Based on the aforementioned or other objectives, the present invention proposes a stacked organic electroluminescent device, which includes a substrate, an anode layer, a plurality of organic emitting layers, a plurality of carrier generation layers (CGL), a plurality of reflecting layers, and a cathode layer. The substrate has a first emitting region, a second emitting region, and a third emitting region. The anode layer is disposed on the substrate. The first organic emitting layer is disposed on the anode layer. The second organic emitting layer is disposed on the first organic emitting layer. The third organic emitting layer is disposed on the second organic emitting layer. The first carrier generation layer is disposed between the first organic emitting layer and the second organic emitting layer. The second carrier generation layer is disposed between the second organic emitting layer and the third organic emitting layer. The first reflecting layer is disposed in the first emitting region and between the substrate and the first organic emitting layer. The second reflecting layer is disposed in the second emitting region and between the first organic emitting layer and the second organic emitting layer. The third reflecting layer is disposed in the third emitting region and between the second organic emitting layer and the third organic emitting layer. The cathode layer is disposed on the third organic emitting layer.

In an embodiment of the present invention, the aforementioned stacked organic electroluminescent device, for example, further includes a color filter array disposed on the cathode layer.

In an embodiment of the present invention, the aforementioned stacked organic electroluminescent device, for example, further includes a hole transport layer (HTL) disposed between the anode layer and the first organic emitting layer.

In an embodiment of the present invention, the aforementioned second reflecting layer is disposed in the second emitting region and between the first carrier generation layer and the second organic emitting layer.

In an embodiment of the present invention, the aforementioned second reflecting layer is disposed in the second emitting region and between the first carrier generation layer and the first organic emitting layer.

In an embodiment of the present invention, the aforementioned third reflecting layer is disposed in the third emitting region and between the second carrier generation layer and the third organic emitting layer.

In an embodiment of the present invention, the aforementioned third reflecting layer is disposed in the third emitting region and between the second carrier generation layer and the second organic emitting layer.

In an embodiment of the present invention, the material of the aforementioned first carrier generation layer and the second carrier generation layer, for example, is selected from $WO_3$ and combinations thereof.

In an embodiment of the present invention, the material of the aforementioned first reflecting layer, the second reflecting layer, and the third reflecting layer, for example, is selected from the group including aluminum, chromium, silver, magnesium alloy and combinations thereof.

In an embodiment of the present invention, the material of the aforementioned anode layer, for example, includes a transparent or non-transparent conductive material.

In an embodiment of the present invention, the material of the aforementioned cathode layer, for example, includes a transparent conductive material.

The present invention proposes a method for manufacturing of a stacked organic electroluminescent device having the following procedures. First, provides a substrate with a first emitting region, a second emitting region, and a third emitting region. Later, forms a first reflecting layer above the first emitting region. Furthermore, forms an anode layer, which covers the first reflecting layer, above the substrate. Afterwards, forms a first organic emitting layer above the anode layer. Later, forms a first carrier generation layer above the first organic emitting layer. Furthermore, forms a second organic emitting layer above the first carrier generation layer. Afterwards, forms a second carrier generation layer above the second organic emitting layer. Later, forms a third organic emitting layer above the second carrier generation layer. Afterwards, forms a cathode layer above the third organic emitting layer. Wherein, between the first organic emitting layer and the second organic emitting layer, and above the second emitting region, further includes the forming of the second reflecting layer. And disposed between the second organic emitting layer and the third organic emitting layer, and in the third emitting region, further includes the forming of the third reflecting layer.

In an embodiment of the present invention, the process for forming the aforementioned first organic emitting layer, the second organic emitting layer, and the third organic emitting layer is using the same patterned mask.

In an embodiment of the present invention, the aforementioned method for manufacturing of the stacked organic electroluminescent device, for example, further includes the forming of a color filter array above the cathode layer.

In an embodiment of the present invention, the aforementioned method for manufacturing of stacked organic electroluminescent device, for example, further includes the forming of a hole transport layer between the anode layer and the first organic emitting layer.

In an embodiment of the present invention, the material of the aforementioned first carrier generation layer and the second carrier generation layer, for example, is selected from the group including $WO_3$ and combinations thereof.

In an embodiment of the present invention, the material of the aforementioned first reflecting layer, the second reflecting layer, and the third reflecting layer is selected from the group including aluminum, chromium, silver, magnesium alloy and combinations thereof.

In an embodiment of the present invention, the material of the aforementioned anode layer, for example, includes a transparent or non-transparent conductive material.

In an embodiment of the present invention, the material of the aforementioned cathode layer, for example, includes a transparent conductive material.

The present invention is adopting overall stacking of the organic emitting layer to provide full color spectrum capability and to achieve colored light with improved color purity. In addition, the present invention uses the same patterned mask with the vapor deposition process for forming the stacked organic emitting layer structures. Therefore, the amount of the patterned mask can be reduced, and thus reducing production cost. In addition, the layered setup of the reflecting layers can increase the luminant efficiency of the stacked organic electroluminescent device, and thus increasing its brightness.

To better understand the aforementioned advantages, characteristics, and functionalities, further details of the present invention, and further features and benefits thereof, are described below. The accompanying drawings, which are incorporated herein, illustrate the present invention and, together with the embodiments, further serve to explain the principles of the invention.

DESCRIPTION OF THE PREFERRED EMBODIMENT

First Embodiment

Figure 1:
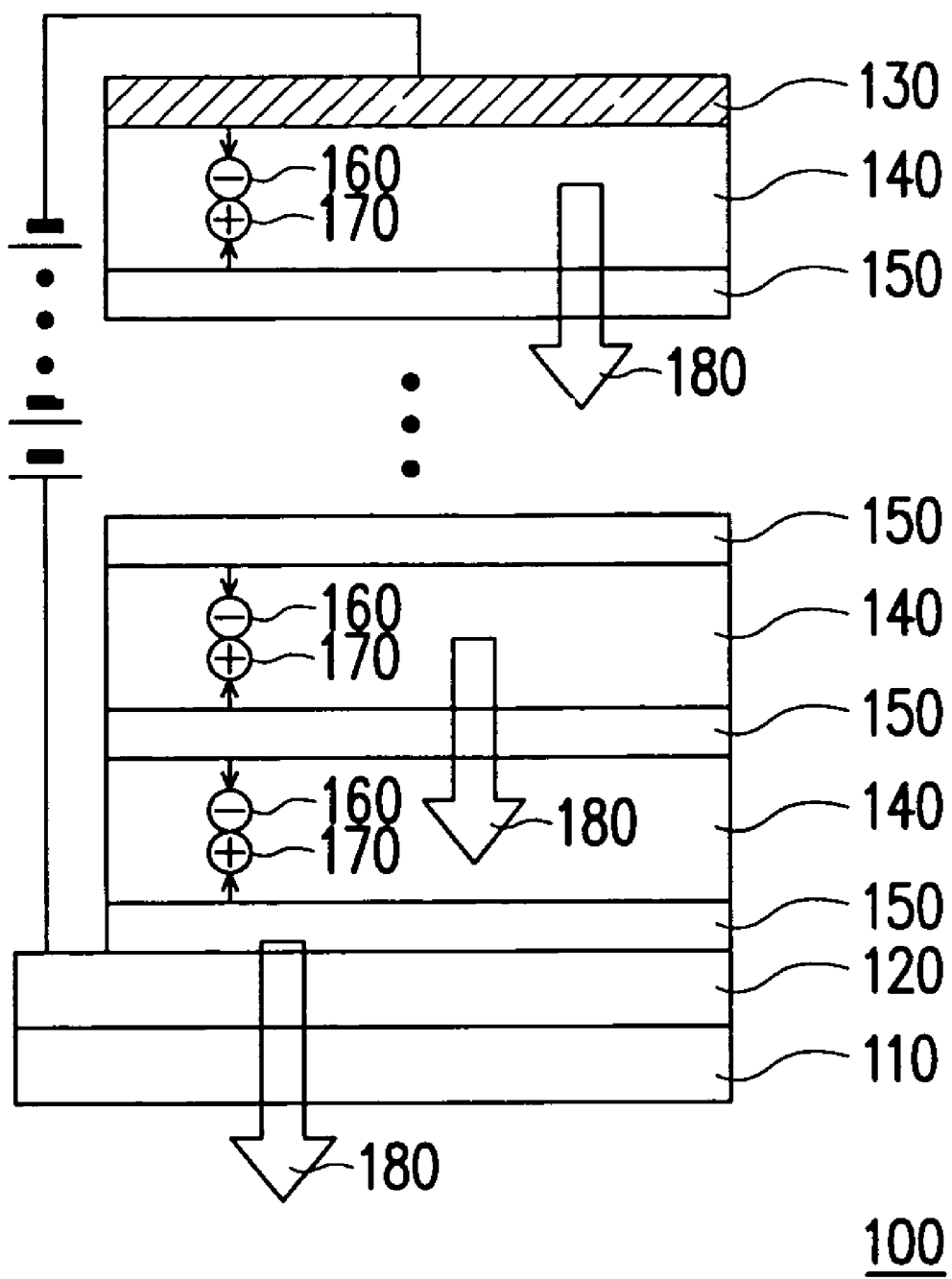
FIG. 1 is a schematic diagram illustrating a conventional multilayer stacked OLED.
Figure 2:
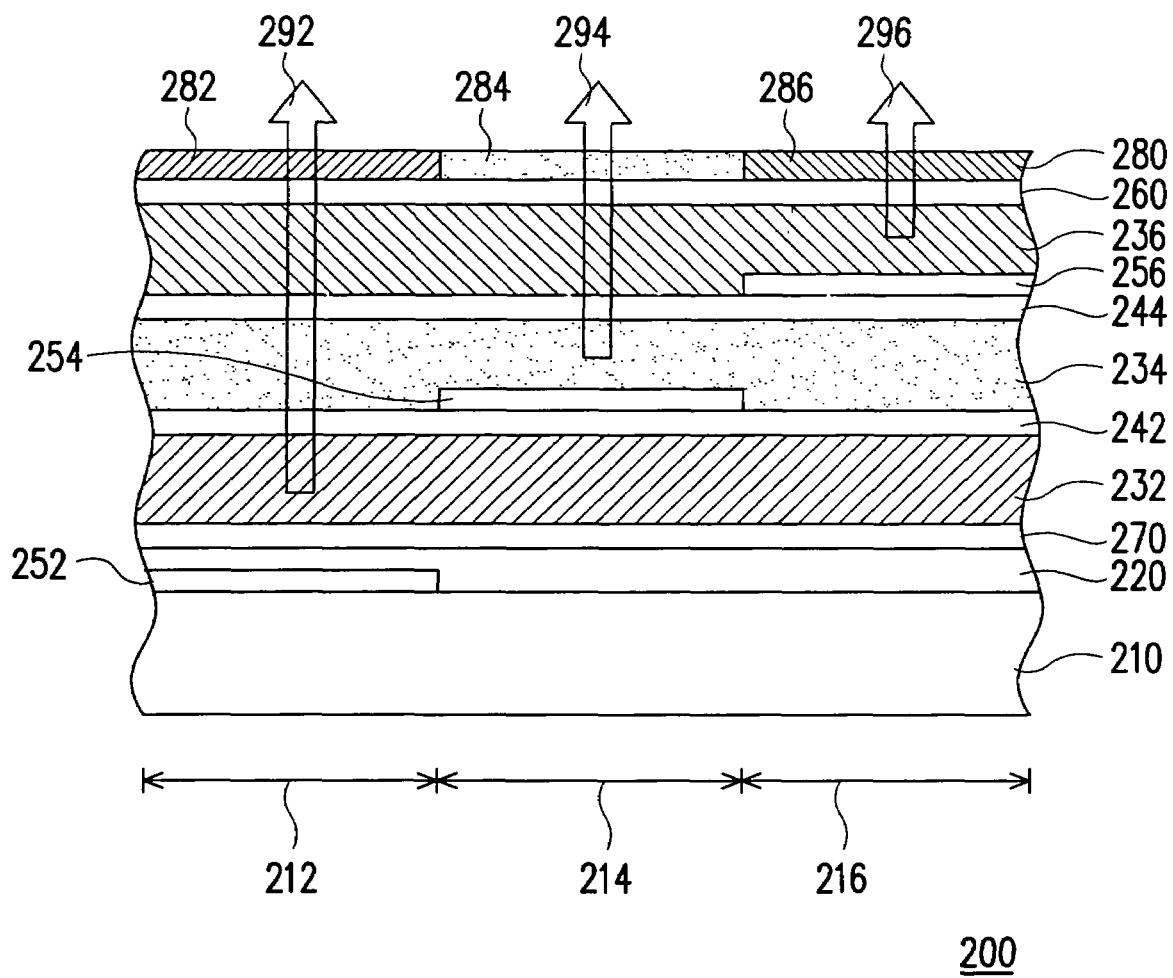
FIG. 2 is a structural schematic diagram illustrating a stacked organic electroluminescent device, according to an embodiment of the present invention.

FIG. 2 is a structural schematic diagram illustrating a stacked organic electroluminescent device for an embodiment of the present invention. Referring to FIG. 2, this stacked organic electroluminescent device 200 includes a substrate 210, an anode layer 220, a plurality of organic emitting layers 232, 234, 236, a plurality of carrier generation layers 242, 244, a plurality of reflecting layers 252, 254, 256 and a cathode layer 260, wherein the substrate 210 has a first emitting region 212, a second emitting region 214, and a third emitting region 216. The anode layer 220 is disposed above the substrate 210. The organic emitting layer 232 is disposed above the anode layer 220. The organic emitting layer 234 is disposed above the organic emitting layer 232. The organic emitting layer 236 is disposed above the organic emitting layer 234. The carrier generation layer 242 is disposed between the organic emitting layer 232 and the organic emitting layer 234. The carrier generation layer 244 is disposed between the organic emitting layer 234 and the organic emitting layer 236. The reflecting layer 252 is disposed in the first emitting region 212 and is disposed between the substrate 210 and the organic emitting layer 232. The reflecting layer 254 is disposed in the second emitting region 214 and is disposed between the organic emitting layer 232 and the organic emitting layer 234. The reflecting layer 256 is disposed in the third emitting region 216 and is disposed between the organic emitting layer 234 and the organic emitting layer 236. And the cathode layer 260 is disposed above the organic emitting layer 236.

Continuing to refer to FIG. 2, the substrate 210 can be a plastic substrate or a glass substrate. And the material of the anode layer 220, which is disposed above the substrate 210, for example, is a transparent or non-transparent conductive material. And the material of the cathode layer 260, for example, is a transparent conductive material for allowing each colored light 292, 294, 296 for passing through. The aforementioned transparent conductive material, for example, can be selected from indium-tin oxide, indium-zinc oxide, aluminum-zinc oxide, cadmium-tin oxide, and others. And the aforementioned non-transparent material, for example, can be selected from a metal or an alloy.

Between the anode layer 220 and the cathode layer 260, the stacked structures of a plurality of organic emitting layers 232, 234, 236, carrier generation layers 242, 244, and reflecting layers 252, 254, 256 are disposed, wherein the organic emitting layer 232, for example, emits red light. The organic emitting layer 234, for example, emits green light. And the organic emitting layer 236, for example, emits blue light.

Particularly, the stacked organic electroluminescent device 200 of the present invention has a special characteristic that is the using of overall stacking of each organic emitting layer 232, 234, 236. And, the allocation of the carrier generation layer 242, 244 between each organic emitting layer 232, 234, 236 allows the charge carrier to transmit smoothly. In an embodiment, the material of the carrier generation layer 242 and of the carrier generation layer 244, for example, is selected from $WO_3$.

Furthermore, due to the organic electroluminescent device of the present invention adopting a overall stacked structure design, therefore, the same patterned mask (not illustrated) can be used to perform the full surface vapor deposition for disposing the organic emitting layers 232, 234, 236 sequentially. Unlike the conventional full color spectrum organic electroluminescent device, which requires different patterned mask (at least three) to perform the vapor deposition, and further defining each independent organic luminescent structure in each emitting region. Therefore, the stacked organic electroluminescent device 200 of the present invention can save costs of patterned masks, thus production cost is reduced.

Another special feature of the present invention is that the reflecting layer 252, 254, 256 are disposed in the stacked structure of the stacked organic electroluminescent device 200 and in the corresponding first emitting region 212, the second emitting region 214, and the third emitting region 216 appropriately. As a result, the emitting rays from each organic emitting layer 232, 234, 236 directing towards the substrate 210 (not illustrated), can be reflected by the reflecting layers 252, 254, 256. So, the reflecting rays can be combined with the emitting rays from each organic emitting layer 232, 234, 236 heading towards the direction of the cathode layer 260 (in the visual direction). And producing each colored light 292, 294, 296 having improved luminant efficiency. Therefore, using the setup of the reflecting layer 252, 254, 256 can increase the luminant efficiency of the stacked organic electroluminescent device 200.

Particularly, the position of the reflecting layer 252, 254, 256 are disposed in different layers, and the locations can be adjusted appropriately. Referring to FIG. 2, using the reflecting layers 254, 256 as examples in an embodiment, the reflecting layer 254, for example, is disposed in the second emitting region 214 and is disposed between the carrier generation layer 242 and the organic emitting layer 234. In another embodiment, the reflecting layer 254 can also be disposed in the second emitting region 214 and between the carrier generation layer 242 and the organic emitting layer 232 (not illustrated).

Continuing referring to FIG. 2, the reflecting layer 256, for example, is disposed in the third emitting region 216 and between the carrier generation layer 244 and the organic emitting layer 236. In another embodiment, the reflecting layer 256 can also be disposed in the third emitting region 216 and is disposed between the carrier generation layer 244 and the organic emitting layer 234 (not illustrated). Furthermore, the material of the reflecting layer 252, 254, 256, for example, is selected from the group including aluminum, chromium, silver, magnesium, alloy, and combinations thereof.

Continuing referring to FIG. 2, in an embodiment of the present invention, the stacked organic electroluminescent device 200, for example, further includes a hole transport layer 270. And it is disposed between the anode layer 220 and the organic emitting layer 232. The material of this hole transport layer 270, for example, is selected from or polymer materials such as polyethylene dioxythiophene (PEDOT) and polystyrene sulfonate (PSS), and can also be other known hole transport materials. Its function is to assist the transportation of electron hole.

Furthermore, the stacked organic electroluminescent device 200 illustrated in FIG. 2, for example, further includes a color filter array 280, disposed above the cathode layer 260. The color filter array 280 has a red filter 282, a green filter 284 and a blue filter 286 for filtering each colored light 292, 294, 296 to output red light, green light, and blue light having improved color purity.

Figure 3A:
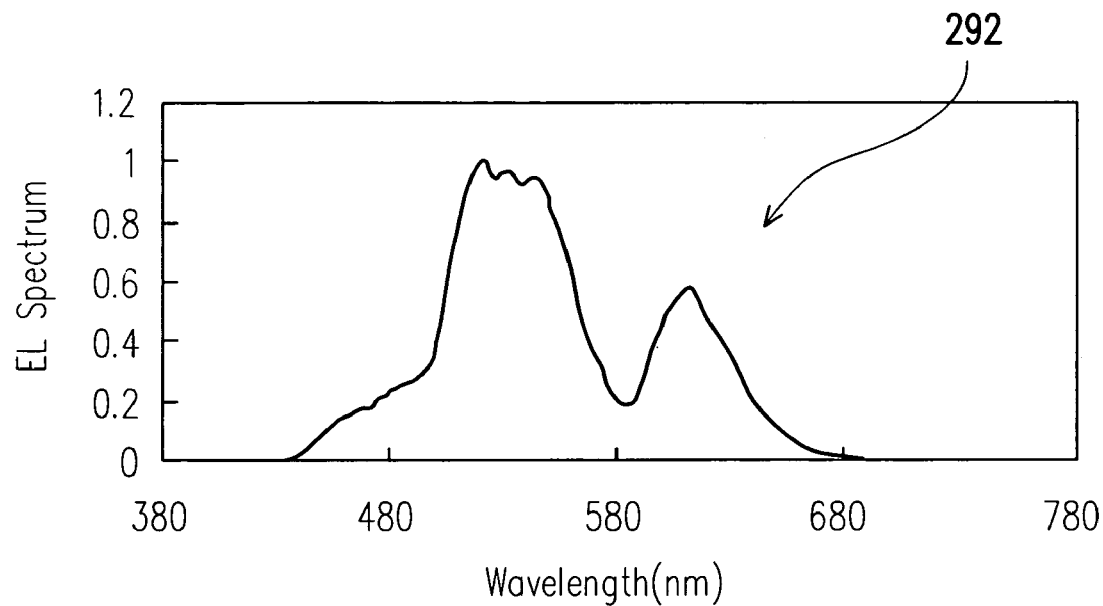
FIG. 3A is a schematic diagram illustrating the emission spectrum for colored light without having passing through the red filter.
Figure 3B:
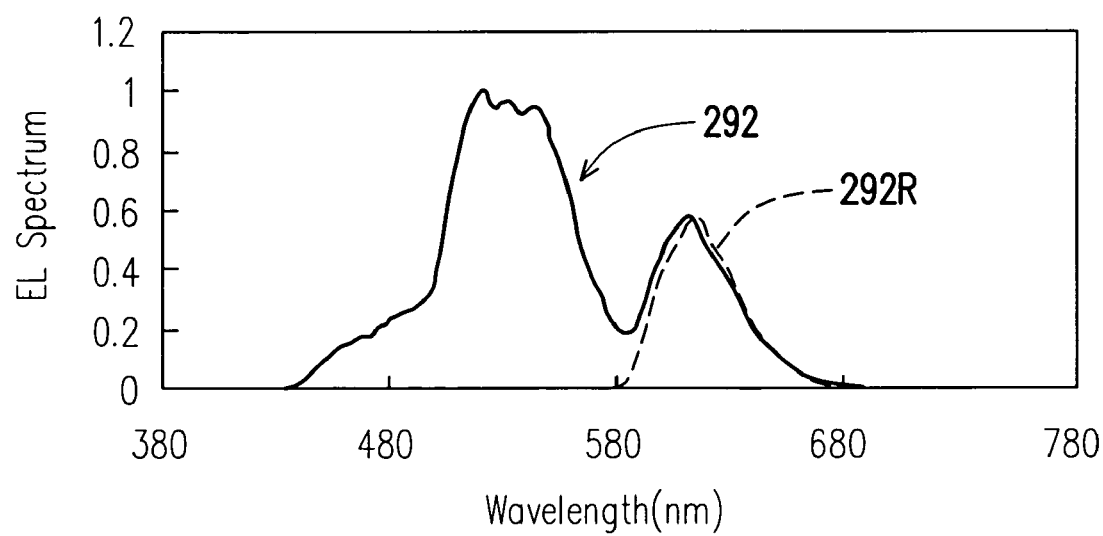
FIG. 3B is a schematic diagram illustrating the emission spectrum for the colored light after passing through the red filter.

FIG. 3A is a schematic diagram illustrating the emission spectrum for colored light without having passing through the red filter. FIG. 3B is a schematic diagram illustrating the emission spectrum for the colored light after passing through the red filter. Referring to FIG. 2, anyone can know that the colored light 292 emitted from the first emitting region 212, includes the red light emitted from the organic emitting layer 232, the green light emitted from the organic emitting layer 234, and the blue light emitted from the organic emitting layer 236. Therefore, referring to the spectrum in FIG. 3A, the colored light 292 includes the red, green and blue light components. As the colored light 292 passing through the red filter 282, the red light component of the colored light 292 is filtered out. So, a red light 292R having improved color purity, as illustrated in FIG. 3B, is provided.

Figure 4A:
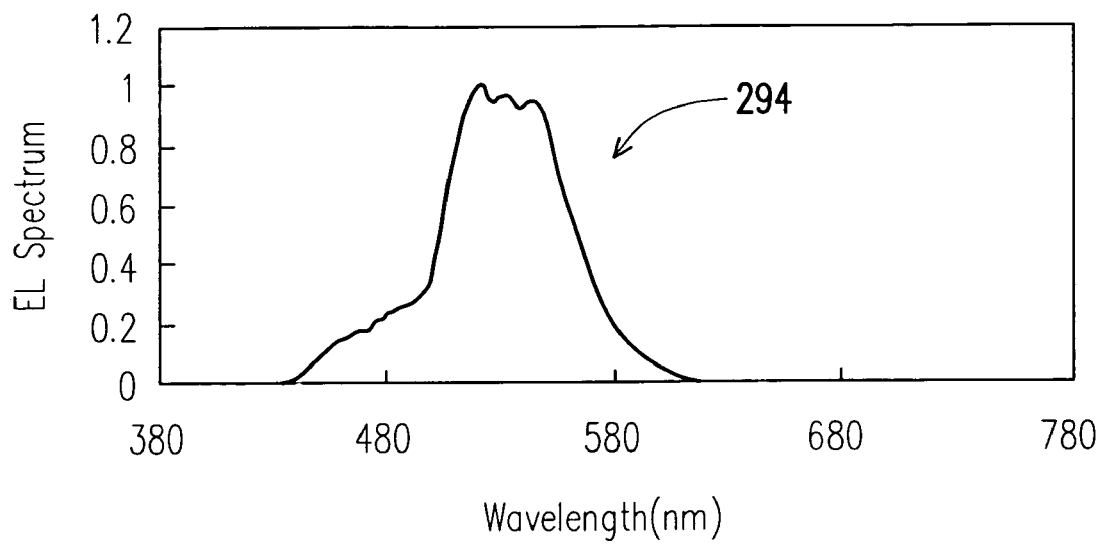
FIG. 4A is a schematic diagram illustrating the emission spectrum for the colored light without having passing through the green filter.
Figure 4B:
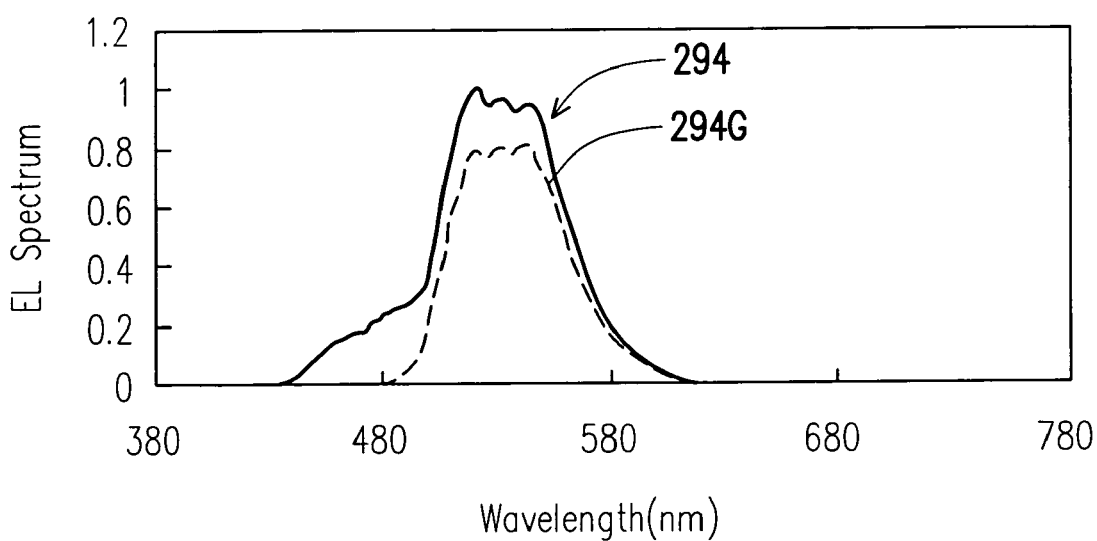
FIG. 4B is a schematic diagram illustrating the emission spectrum for the colored light after passing through the green filter.

FIG. 4A is a schematic diagram illustrating the emission spectrum for the colored light without having passing through the green filter. FIG. 4B is a schematic diagram illustrating the emission spectrum for the colored light after passing through the green filter. Referring to FIG. 2, anyone can know that the colored light 294 emitted from the second emitting region 214, includes the green light emitted from the organic emitting layer 234, and the blue light emitted from the organic emitting layer 236. Therefore, referring to FIG. 4A, the colored light 294 includes the green and blue light components. As the colored light 294 is filtered by the green filter 284, the green light component is filtered out from the colored light 294. And the green light 294G with improved color purity, as illustrated in FIG. 4B, is provided.

Figure 5:
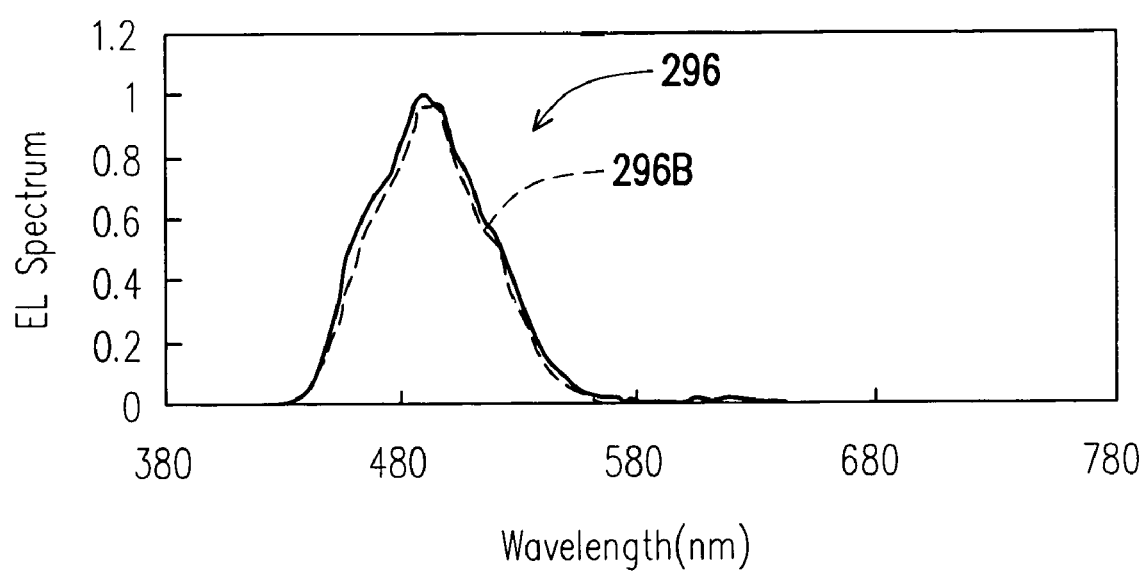
FIG. 5 is a schematic diagram illustrating the emission spectrum for the colored light after passing through the blue filter.

FIG. 5 is a schematic diagram illustrating the emission spectrum for the colored light after passing through the blue filter. Referring to FIG. 2, anyone can know that the colored light 296 emitted from the third emitting region 216 only includes the blue light component. Therefore, as can be seen from the spectrum in FIG. 5, after the colored light 296 passing through the blue filter 284, the obtained blue light 296B, and the colored light 296 are almost same.

In summary, the stacked organic electroluminescent device 200 of the present invention uses overall stacking of the organic emitting layers 232, 234, 236, for arriving at the results of full color spectrum and obtaining colored light with improved color purity. Only one patterned mask is needed to produce the stacking of all the organic emitting layers 232, 234, 236, thus the production cost can be reduced. Furthermore, the reflecting layers 252, 254, 256 disposed in different layers can increase the luminant efficiency and brightness of the stacked organic electroluminescent device 200.

Second Embodiment

FIG. 6A to FIG. 6E are procedural flow schematic diagrams illustrating the method for manufacturing of a stacked organic electroluminescent device, according to an embodiment of the present invention. Please refers to the procedures illustrated in FIG. 6A to FIG. 6E., and this is a continuous process.

Figure 6A:
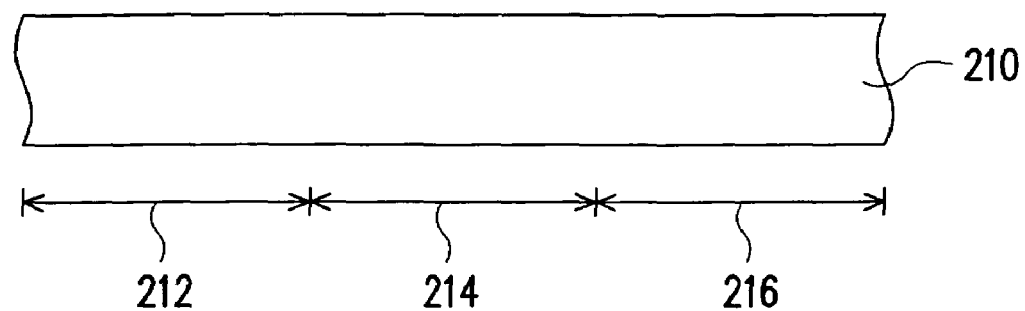
FIG. 6A to FIG. 6E are procedural flow schematic diagrams illustrating the method for manufacturing of a stacked organic electroluminescent device, according to an embodiment of the present invention.

First, as illustrated in FIG. 6A, a substrate 210 is provided. It has the first emitting region 212, the second emitting region 214, and the third emitting region 216. The substrate 210, for example, is a plastic or glass substrate.

Figure 6B:
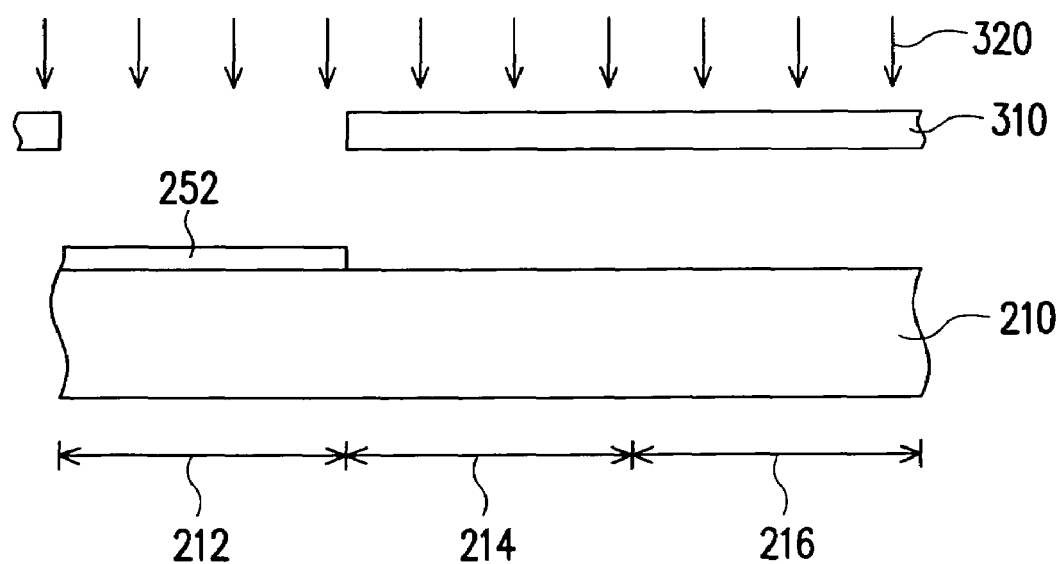

Later, as illustrated in FIG. 6B, the reflecting layer 252 is formed above the first emitting region 212. The reflecting layer 252 is disposed in the first emitting region 212 and above the substrate 210. The method for forming the reflecting layer 252, for example, uses a patterned mask 310 to perform. The reflecting layer 252 is formed in the first emitting region 212 on the substrate 210. In an embodiment of the present invention, the material of reflecting layer 252, for example, is selected from the group including aluminum, chromium, silver, magnesium, alloy and combinations thereof.

Figure 6C:
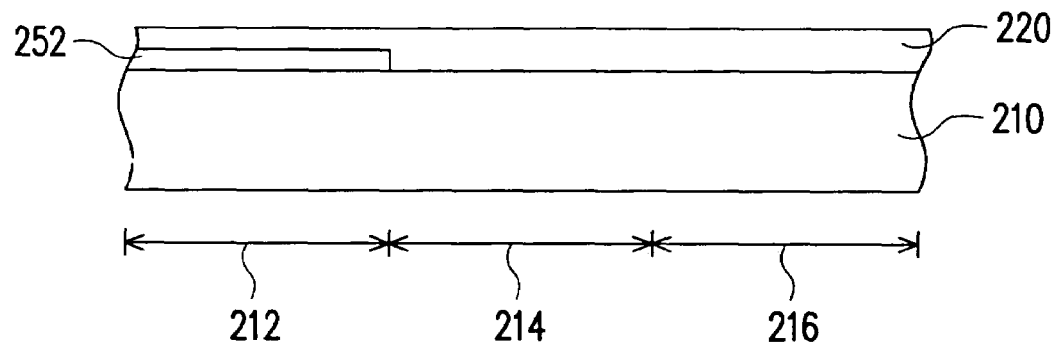

Then, as illustrated in FIG. 6C, the anode layer 220 is formed above the substrate 210; and the anode layer 220 covers the reflecting layer 252. The method for forming the anode layer 220, for example, uses sputtering process to comprehensively form the anode layer 220 above the substrate 210. In an embodiment, the material of the anode layer 220, for example, includes transparent or non-transparent conductive material, wherein the non-transparent conductive material, for example, is a metal, alloy or others. And the transparent conductive material, for example, includes indium-tin oxide, indium-zinc oxide, aluminum-zinc oxide, cadmium-tin oxide and others.

Figure 6D:
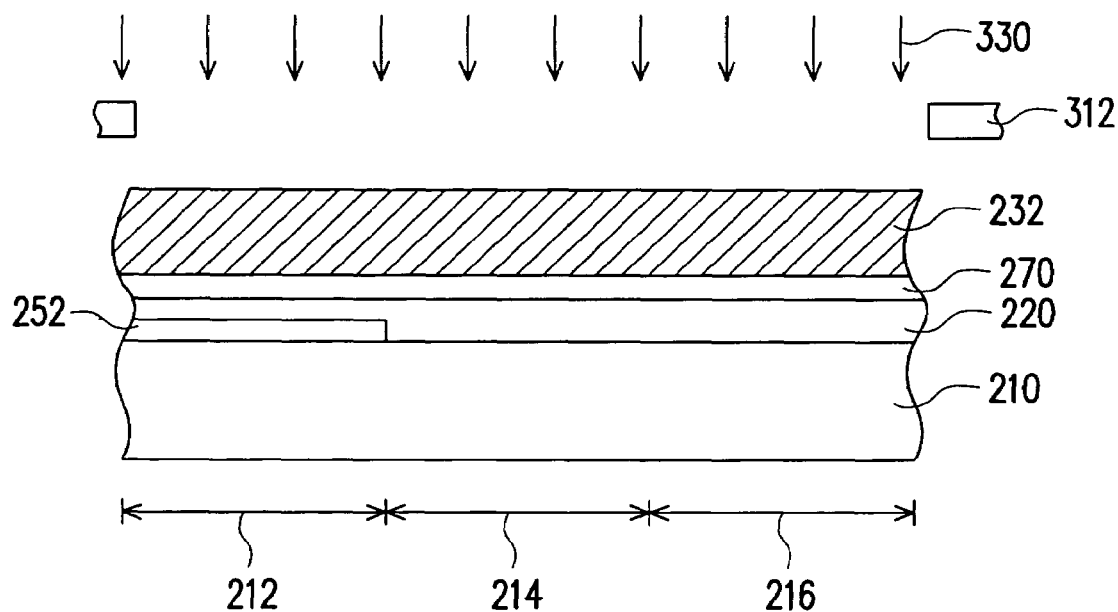

Later, as illustrated in FIG. 6D, the organic emitting layer 232 is formed above the anode layer 220. The method for forming the organic emitting layer 232, for example, uses a patterned mask 312 to perform the vapor deposition process 330. So, the organic material can be comprehensively formed on the anode layer 220. In an embodiment, a hole transport layer 270 can be formed between the anode layer 220 and the organic emitting layer 232 for improving the hole transportation between the anode layer 220 and the organic emitting layer 232.

Figure 6E:
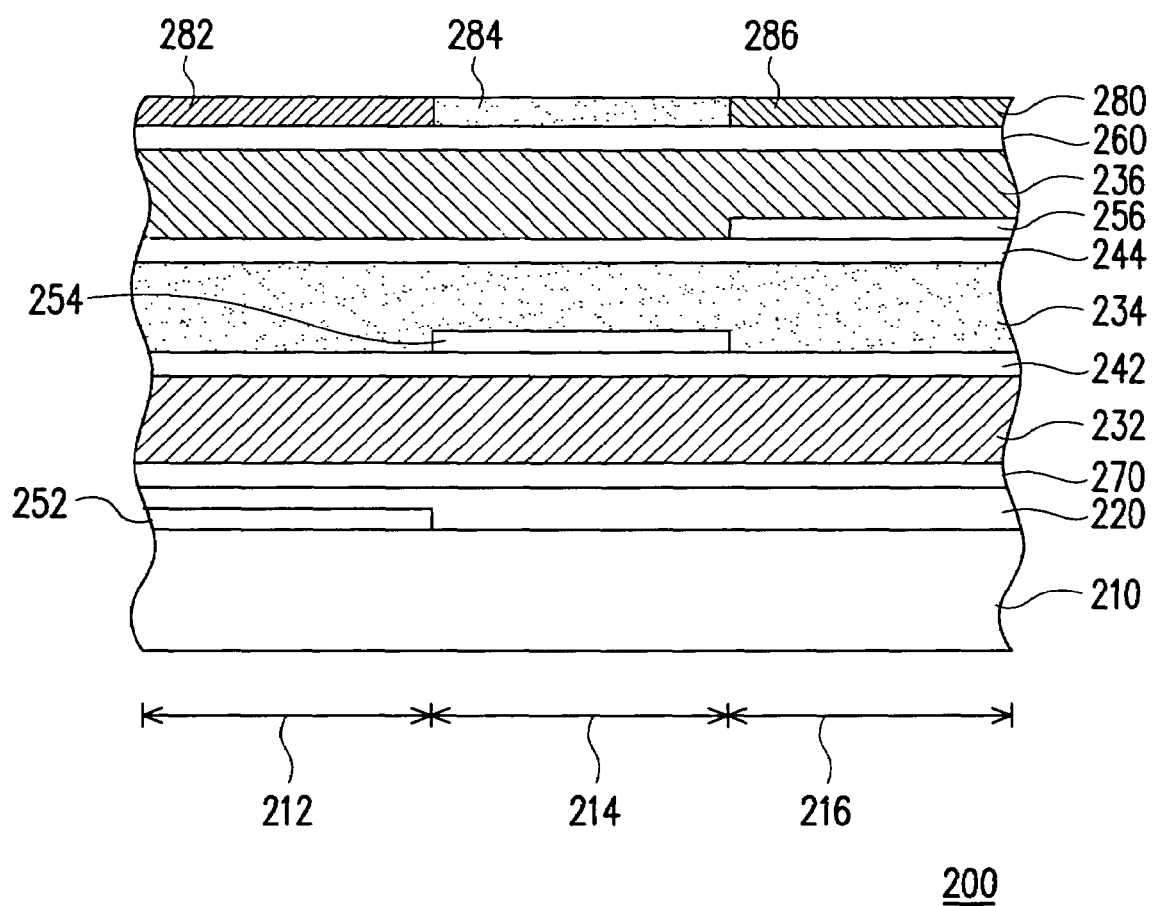

Afterwards, as illustrated in FIG. 6E, the carrier generation layer 242 is formed above the organic emitting layer 232. The organic emitting layer 234 is formed above the carrier generation layer 242. The carrier generation layer 244 is formed above the organic emitting layer 234. The organic emitting layer 236 is formed above the carrier generation layer 244. And the cathode layer 260 is formed above the organic emitting layer 236, wherein the reflecting layer 254 is formed between the organic emitting layer 232 and the organic emitting layer 234, and in the position of the second emitting region 214. And the reflecting layer 256 is formed between the organic emitting layer 234 and the organic emitting layer 236, and in the position of third emitting region 216. The materials of the carrier generation layers 242, 244, the reflecting layers 252, 254, 256, and the cathode layer 260 are already described in the first embodiment, so no further descriptions are repeated. The method of forming the carrier generation layer 242, 244 is similar to the organic emitting layer 232 described in FIG. 6D. In other word, the carrier generation layer 242, 244 can be manufactured using a patterned mask (not illustrated) with the vapor deposition process. Besides, the forming method of the reflecting layer 254, 256 is similar to the described manufacturing method in FIG. 6B of the reflecting layer 252, but different patterned mask (not illustrated) are used to perform the sputtering process 320.

Particularly, in an embodiment of the present invention, the aforementioned forming process for the organic emitting layer 232, the organic emitting layer 234, and the organic emitting layer 236 uses the same patterned mask 312. Therefore, the stacked organic electroluminescent device 200 of the present invention can save the cost of patterned masks. Unlike the conventional full color spectrum organic electroluminescent device, it requires different patterned masks (at least three) to perform the vapor deposition method for defining various organic luminant structures in different emitting regions.

Referring to FIG. 6E, a color filter array 280 is further formed above the cathode layer 280. The color filter array 280 has the red filter 282, the green filter 284, and the blue filter 286. The color filter array 280 is used to provide colored lights having improved color purity. And the method for forming the color filter array 280, for example, is printing method or ink jet.

Based on the aforementioned, the stacked organic electroluminescent device has the following advantages in the present invention:

(1) the stacked organic electroluminescent device of the present invention uses overall stacking of the organic emitting layer, and can achieve full color spectrum results and can obtain colored light with improved color purity; and it uses the same patterned mask to perform the vapor deposition process for forming the stacked organic emitting layer structure. Therefore, the amount of patterned mask can be reduced, thus production cost is reduced too.

(2) The reflecting layers are disposed in different layers appropriately. So, the luminant efficiency and brightness of the stacked organic electroluminescent device of the present invention can be increased.

Although an embodiment has been mentioned above to explain this invention, it does not limit to this invention. It will be apparent to those skilled in the art that various modifications and variations can be made to the structure of the present invention without departing from the scope or spirit of it. In view of the foregoing, it is intended that the present invention cover modifications and variations of this invention provided they fall within the scope of the following claims and their equivalents.

What is claimed is:

1. A stacked organic electroluminescent device, comprising:
   a substrate, having a first luminescent region, a second luminescent region, and a third luminescent region;
   an anode layer, disposed above the substrate;

a first organic emitting layer, disposed above the anode layer;

a second organic emitting layer, disposed above the first organic emitting layer;

a third organic emitting layer, disposed above the second organic emitting layer;

a first carrier generation layer, disposed between the first organic emitting layer and the second organic emitting layer;

a second carrier generation layer, disposed between the second organic emitting layer and the third organic emitting layer;

a first reflecting layer, disposed in the first emitting region and between the substrate and the first organic emitting layer;

a second reflecting layer, disposed in the second emitting region and between the first organic emitting layer and the second organic emitting layer;

a third reflecting layer, disposed in the third emitting region and between the second organic emitting layer and the third organic emitting layer; and a cathode layer, disposed above the third organic emitting layer.

2. The stacked organic electroluminescent device in claim 1, further comprises a color filter array disposed above the cathode layer.

3. The stacked organic electroluminescent device in claim 1, further comprises a hole transport layer disposed between the anode layer and the first organic emitting layer.

4. The stacked organic electroluminescent device in claim 1, wherein the second reflecting layer is disposed in the second emitting region, and between the first carrier generation layer and the second organic emitting layer.

5. The stacked organic electroluminescent device in claim 1, wherein the second reflecting layer is disposed in the second emitting region, and between the first carrier generation layer and the first organic emitting layer.

6. The stacked organic electroluminescent device in claim 1, wherein the third reflecting layer is disposed in the third emitting region, and between the second carrier generation layer and the third organic emitting layer.

7. The stacked organic electroluminescent device in claim 1, wherein the third reflecting layer is disposed in the third emitting region, and between the second carrier generation layer and the second organic emitting layer.

8. The stacked organic electroluminescent device in claim 1, wherein the material of the first carrier generation layer and the second carrier generation layer is selected from the group including $WO_3$ and combinations thereof.

9. The stacked organic electroluminescent device in claim 1, wherein the material of the first reflecting layer, the second reflecting layer and the third reflecting layer is selected from the group including aluminum, chromium, silver, magnesium, alloy and combinations thereof.

10. The stacked organic electroluminescent device in claim 1, wherein the material of the anode layer comprises transparent or non-transparent conductive material.

11. The stacked organic electroluminescent device in claim 1, wherein the material of the cathode layer comprises transparent conductive material.

12. A method for manufacturing a stacked organic electroluminescent device, comprising:

providing a substrate, having a first luminescent region, a second luminescent region, and a third luminescent region;

forming a first reflecting layer above the first emitting region;

forming an anode layer above the substrate, the anode layer covers the first reflecting layer;

forming a first organic emitting layer above the anode layer;

forming a first carrier generation layer above the first organic emitting layer;

forming a second organic emitting layer above the first carrier generation layer;

forming a second carrier generation layer above the second organic emitting layer;

forming a third organic emitting layer above the second carrier generation layer; and forming a cathode layer above the third organic emitting layer, wherein, between the first organic emitting layer and the second organic emitting layer, and located in the location of the second emitting region further comprising the forming of a second reflecting layer; and between the second organic emitting layer and the third organic emitting layer, and located in the location of the third emitting region further comprising the forming of a third reflecting layer.

13. The method for manufacturing the stacked organic electroluminescent device in claim 12, wherein the process for forming the first organic emitting layer, the second organic emitting layer, and the third organic emitting layer uses the same patterned mask.

14. The method for manufacturing the stacked organic electroluminescent device in claim 12, further comprising the forming of a color filter array above the cathode layer.

15. The method for manufacturing the stacked organic electroluminescent device in claim 12, further comprising the forming of a hole transport layer between the anode layer and the first organic emitting layer.

16. The method for manufacturing the stacked organic electroluminescent device in claim 12, wherein the material of the first carrier generation layer and the second carrier generation layer is selected from the group including $WO_3$ and combinations thereof.

17. The method for manufacturing the stacked organic electroluminescent device in claim 12, wherein the material of the first reflecting layer, the second reflecting layer and the third reflecting layer is selected from the group including aluminum, chromium, silver, magnesium, alloy and combinations thereof.

18. The method for manufacturing the stacked organic electroluminescent device in claim 12, wherein the material of the anode layer comprises transparent or a non-transparent conductive material.

19. The method for manufacturing the stacked organic electroluminescent device in claim 12, wherein the material of the cathode layer comprises transparent conductive material.

* * * * *